(12) United States Patent
Jain et al.

(10) Patent No.: US 12,336,206 B2
(45) Date of Patent: Jun. 17, 2025

(54) HETEROJUNCTION BIPOLAR TRANSISTORS WITH A CUT STRESS LINER

(71) Applicant: GlobalFoundries U.S. Inc., Malta, NY (US)

(72) Inventors: Vibhor Jain, Essex Junction, VT (US); Jeffrey Johnson, Essex Junction, VT (US); Viorel Ontalus, Unionville, CT (US); John J. Pekarik, Underhill, VT (US)

(73) Assignee: GlobalFoundries U.S. Inc., Malta, NY (US)

( * ) Notice: Subject to any disclaimer, the term of this patent is extended or adjusted under 35 U.S.C. 154(b) by 362 days.

(21) Appl. No.: 17/990,931

(22) Filed: Nov. 21, 2022

(65) Prior Publication Data

US 2024/0170561 A1    May 23, 2024

(51) Int. Cl.
*H10D 10/80* (2025.01)
*H10D 10/01* (2025.01)
*H10D 62/13* (2025.01)

(52) U.S. Cl.
CPC ......... *H10D 10/891* (2025.01); *H10D 10/021* (2025.01); *H10D 62/136* (2025.01)

(58) Field of Classification Search
CPC ............ H01L 29/7378; H01L 29/0817; H01L 29/66242; H01L 29/0649; H01L 29/0821; H01L 29/7371; H01L 29/737; H01L 29/0603; H01L 29/41708; H01L 29/42304
See application file for complete search history.

(56) References Cited

U.S. PATENT DOCUMENTS

| 7,102,205 | B2 | 9/2006 | Chidambarrao et al. |
| 7,262,484 | B2 | 8/2007 | Dunn et al. |
| 9,608,096 | B1 | 3/2017 | Camillo-Castillo et al. |
| 9,825,157 | B1 | 11/2017 | Jain et al. |

(Continued)

FOREIGN PATENT DOCUMENTS

| CN | 107546264 A | 1/2018 |
| TW | 200623392 A | 7/2006 |
| TW | 201801314 A | 1/2018 |

OTHER PUBLICATIONS

European Patent Office, Extended European Search Report and Opinion issued in European Patent Application No. 23202868.8 on Mar. 11, 2024; 11 pages.

(Continued)

*Primary Examiner* — Mohammad A Rahman
(74) *Attorney, Agent, or Firm* — Thompson Hine LLP; Francois Pagette (57) ABSTRACT

Structures for a heterojunction bipolar transistor and methods of forming a structure for a heterojunction bipolar transistor. The structure comprises an emitter, a collector including a first section, a second section, and a third section positioned in a first direction between the first section and the second section, and an intrinsic base disposed in a second direction between the emitter and the third section of the collector. The structure further comprises a stress layer including a section positioned to overlap with the emitter, the intrinsic base, and the collector. The section of the stress layer is surrounded by a perimeter, and the first and second sections of the collector are each positioned adjacent to the perimeter of the stress layer.

20 Claims, 10 Drawing Sheets

(56) References Cited

U.S. PATENT DOCUMENTS

| | | | |
|---|---|---|---|
| 10,964,796 | B2 | 3/2021 | Stamper et al. |
| 2007/0298578 | A1 | 12/2007 | Khater et al. |
| 2008/0116488 | A1 | 5/2008 | Shim et al. |
| 2011/0147793 | A1 | 6/2011 | Chiu et al. |
| 2015/0021738 | A1 | 1/2015 | Camillo-Castillo et al. |
| 2015/0024570 | A1 | 1/2015 | Joseph et al. |
| 2015/0137185 | A1* | 5/2015 | Camillo-Castillo ........................ H10D 62/115 438/319 |
| 2017/0330843 | A1* | 11/2017 | Hua .................... H01L 23/3192 |

OTHER PUBLICATIONS

Korean Intellectual Property Office, Notice of Preliminary Rejection issued in Korean Patent Application No. 10-2023-0141846 on Nov. 28, 2024; 12 pages.

Taiwan Intellectual Property Office, Notice of Rejection issued in Taiwanese Patent Application No. 112140347 on Sep. 26, 2024; 14 pages.

Taiwan Intellectual Property Office, Office Action and Search Report issued in Taiwanese Patent Application No. 112140347 on Jun. 18, 2024; 13 pages.

Mahmoud S. Al-Sa'di et al., "Modeling of NPN-SiGe-HBT Electrical Performance Improvement through Employing Si3N4 Strain in the Collector Region." ESC Transactions, vol. 33, No. 36; DOI 10.1149/1.3487548, 191 (Oct. 1, 2010).

Gu, Man et al., "Bipolar Junction Transistors Including a Stress Liner" filed on Nov. 11, 2021 as a U.S. Appl. No. 17/524,438.

Singh, Jagar et al., "Lateral Bipolar Junction Transistor Including a Stress Layer and Method" filed on Dec. 20, 2021 as a U.S. Appl. No. 17/555,561.

* cited by examiner

HETEROJUNCTION BIPOLAR TRANSISTORS WITH A CUT STRESS LINER

STATEMENT REGARDING FEDERALLY SPONSORED RESEARCH OR DEVELOPMENT

This invention was made with government support under HR0011-20-3-0002 awarded by the Defense Advanced Research Projects Agency. The government has certain rights in the invention.

BACKGROUND

The disclosure relates generally to semiconductor devices and integrated circuit fabrication and, in particular, to structures for a heterojunction bipolar transistor and methods of forming a structure for a heterojunction bipolar transistor.

A bipolar junction transistor is a three-terminal electronic device that includes an emitter, a collector, and an intrinsic base that defines a p-n junction with the emitter and a p-n junction with the collector. In a PNP heterojunction bipolar transistor, the emitter and collector are comprised of p-type semiconductor material, and the intrinsic base is comprised of n-type semiconductor material. In an NPN heterojunction bipolar transistor, the emitter and collector are comprised of n-type semiconductor material, and the intrinsic base is comprised of p-type semiconductor material. In operation, the base-emitter junction is forward biased, the base-collector junction is reverse biased, and the collector-emitter current may be controlled with a base-emitter voltage.

A heterojunction bipolar transistor is a variant of a bipolar junction transistor in which the semiconductor materials have different energy bandgaps, which creates heterojunctions. For example, the collector and emitter of a heterojunction bipolar transistor may be constituted by silicon, and the intrinsic base of a heterojunction bipolar transistor may be constituted by silicon-germanium, which is characterized by a narrower band gap than silicon. Heterojunction bipolar transistors may exhibit improvements in high frequency performance as a result of the introduction of heterojunctions.

Improved structures for a heterojunction bipolar transistor and methods of forming a structure for a heterojunction bipolar transistor are needed.

SUMMARY

In an embodiment, a structure for a heterojunction bipolar transistor is provided. The structure comprises an emitter, a collector including a first section, a second section, and a third section positioned in a first direction between the first section and the second section, and an intrinsic base disposed in a second direction between the emitter and the third section of the collector. The structure further comprises a stress layer including a section positioned to overlap with the emitter, the intrinsic base, and the collector. The section of the stress layer is surrounded by a perimeter, and the first and second sections of the collector are each positioned adjacent to the perimeter of the stress layer.

In an embodiment, a method of forming a structure for a heterojunction bipolar transistor. The method comprises forming an emitter, forming a collector including a first section, a second section, and a third section positioned in a first direction between the first section and the second section, and forming an intrinsic base disposed in a second direction between the emitter and the third section of the collector. The method further comprises forming a stress layer including a section positioned to overlap with the emitter, the intrinsic base, and the collector. The section of the stress layer is surrounded by a perimeter, and the first and second sections of the collector are each positioned adjacent to the perimeter of the stress layer.

BRIEF DESCRIPTION OF THE DRAWINGS

The accompanying drawings, which are incorporated in and constitute a part of this specification, illustrate various embodiments of the invention and, together with a general description of the invention given above and the detailed description of the embodiments given below, serve to explain the embodiments of the invention.

FIG. 3A is a top view of the structure in which FIG. 3 is taken generally along line 3-3.

DETAILED DESCRIPTION

Figure 1:
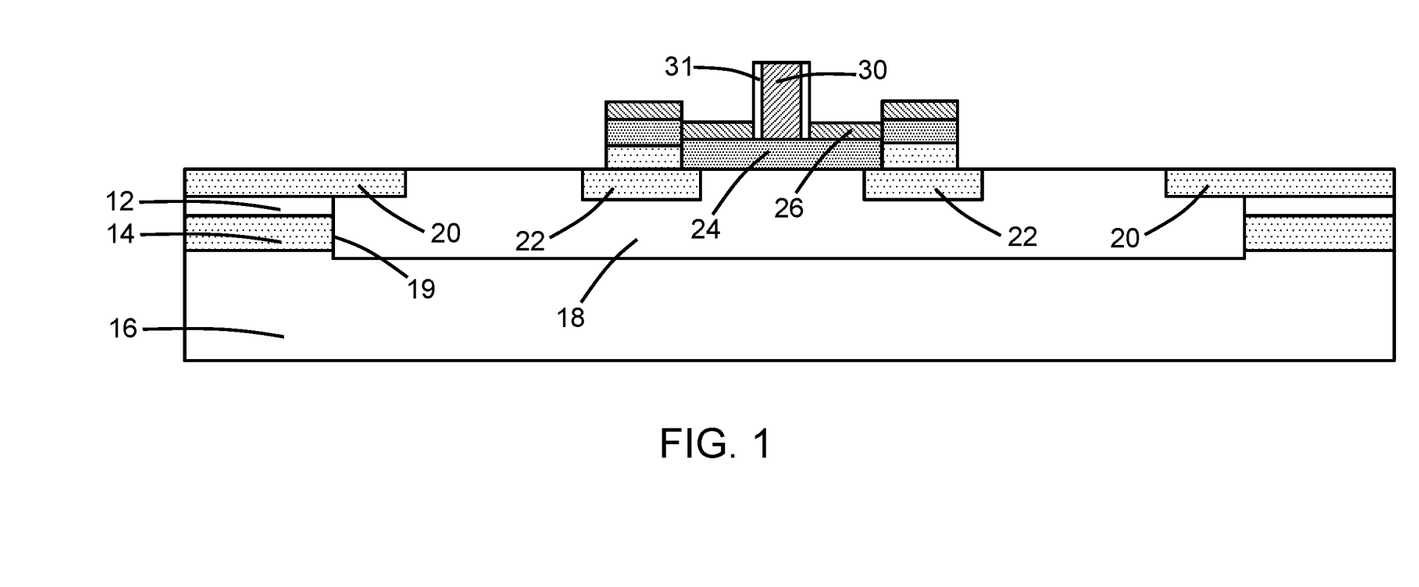
FIG. 1 is a cross-sectional view of a structure at an initial fabrication stage of a processing method in accordance with embodiments of the invention.

With reference to FIG. 1 and in accordance with embodiments of the invention, a semiconductor-on-insulator (SOI) substrate includes a semiconductor layer 12, a buried insulator layer 14, and a semiconductor substrate 16. The semiconductor layer 12 and the semiconductor substrate 16 may be comprised of a semiconductor material, such as single-crystal silicon, and may be lightly doped to have, for example, p-type conductivity. The buried insulator layer 14 may be comprised of a dielectric material, such as silicon dioxide. The semiconductor layer 12 is separated from the semiconductor substrate 16 by the dielectric material of the intervening buried insulator layer 14. The buried insulator layer 14 has a lower interface with the semiconductor substrate 16 and an upper interface with the semiconductor layer 12. The semiconductor layer 12 is electrically isolated from the semiconductor substrate 16 by the buried insulator layer 14. In an embodiment, the semiconductor layer 12 may be considerably thinner than the semiconductor substrate 16. In an embodiment, the semiconductor layer 12 may have a thickness between the upper and lower interfaces in a range of about 20 nanometers (nm) to about 200 nm, and the semiconductor layer 12 may be used to fabricate partially-depleted silicon-on-insulator (PDSOI) device structures.

A semiconductor layer 18 may be formed inside a trench that is patterned by lithography and etching processes in the semiconductor layer 12 and the buried insulator layer 14. The trench in which the semiconductor layer 18 is formed extends fully through the semiconductor layer 12 and the buried insulator layer 14 to the semiconductor substrate 16.

The semiconductor layer 18 has a perimeter 19 at the boundary that is established by the sidewalls of the trench in which the semiconductor layer 18 is formed.

The semiconductor layer 18 may be comprised of a semiconductor material, such as silicon, and the semiconductor layer 18 may be doped to have an opposite conductivity type from the semiconductor substrate 16. In an embodiment, the semiconductor layer 18 may be doped with a concentration of a dopant, such as an n-type dopant (e.g., arsenic or phosphorus) to provide n-type conductivity. The semiconductor layer 18 may be formed using an epitaxial growth process, and the semiconductor layer 18 may contain single-crystal semiconductor material (e.g., single-crystal silicon). The crystal structure of the single-crystal semiconductor material of the semiconductor substrate 16 may serve as a crystalline template for the crystal structure of the single-crystal semiconductor material of the semiconductor layer 18 established during epitaxial growth. The semiconductor layer 18 may provide a collector of a vertical heterojunction bipolar transistor structure.

Shallow trench isolation regions 20, 22 may be formed in the semiconductor layer 18. In an embodiment, the shallow trench isolation regions 20, 22 may be formed by applying and patterning a hardmask, etching trenches using the patterned hardmask, depositing a dielectric material (e.g., silicon dioxide) in the trenches, and planarizing with chemical-mechanical polishing. The shallow trench isolation regions 22 may overlap with the perimeter 19 of the semiconductor layer 18, and respective portions of the semiconductor layer 18 may extend as a sub-collector of the vertical heterojunction bipolar transistor structure beneath the shallow trench isolation regions 20 to connect adjacent sections of the semiconductor layer 18.

A semiconductor layer 24 may be formed on the semiconductor layer 18 and the shallow trench isolation regions 20. The semiconductor layer 24 may be formed by an epitaxial growth process and may contain single-crystal semiconductor material. The semiconductor layer 24 may be doped to have an opposite conductivity type from the semiconductor layer 18. In an embodiment, the semiconductor layer 24 may be doped with a concentration of a dopant, such as a p-type dopant (e.g., boron) to provide p-type conductivity. In an embodiment, the semiconductor layer 24 may have a different composition than the semiconductor layer 18. The semiconductor layer 24 may be comprised of a semiconductor material, such as silicon-germanium including silicon and germanium combined with a silicon content ranging from 95 atomic percent to 50 atomic percent and a germanium content ranging from 5 atomic percent to 50 atomic percent. The germanium content of the semiconductor layer 24 may be uniform, or the germanium content of the semiconductor layer 24 may be graded and/or stepped across its thickness. In an embodiment, the semiconductor layer 24 may include a sublayer of silicon that is grown from the semiconductor layer 18, a subsequently-grown sub-layer of doped and graded silicon-germanium on the undoped sublayer of silicon, and a subsequently-grown sub-layer of silicon on the silicon-germanium sublayer.

A semiconductor layer 26 may be formed on the semiconductor layer 24. In an embodiment, the semiconductor layer 26 may be comprised of a semiconductor material (e.g., silicon or silicon-germanium) formed by an epitaxial growth deposition process. The semiconductor layer 26 may be doped (e.g., heavily doped) with a concentration of a dopant, such as a p-type dopant (e.g., boron) to provide p-type conductivity.

A semiconductor layer 30 may be formed inside an opening that is patterned in the semiconductor layers 24, 26 by lithography and etching processes. The semiconductor layer 30 may be formed by epitaxially growing or depositing a layer comprised of a semiconductor material and patterning the layer with lithography and etching processes. The semiconductor layer 30 may have an opposite conductivity type from the semiconductor layer 24. In an embodiment, the semiconductor layer 30 may be comprised of a doped semiconductor material, such as polysilicon that is heavily doped with an n-type dopant (e.g., phosphorus or arsenic) to provide n-type conductivity. Dielectric spacers 31 comprised of an electrical insulator, such as silicon nitride, may be arranged in a lateral direction between the semiconductor layer 26 and the semiconductor layer 30.

The portion of the semiconductor layer 24 adjoining the semiconductor layer 18 may provide an intrinsic base of the vertical heterojunction bipolar transistor structure, the semiconductor layer 26 may provide an extrinsic base of the vertical heterojunction bipolar transistor structure, and the semiconductor layers 24, 26 may collectively define a base of the vertical heterojunction bipolar transistor structure. The semiconductor layer 30 may provide an emitter of the vertical heterojunction bipolar transistor structure.

The semiconductor layer 24 overlaps with a portion of the semiconductor layer 18, and the semiconductor layer 24 adjoins the overlapped portion of the semiconductor layer 18 along an interface to define a p-n junction. The semiconductor layer 30 overlaps with a portion of the semiconductor layer 24, and the semiconductor layer 30 adjoins the overlapped portion of the semiconductor layer 24 along an interface to define a p-n junction. More specifically, the p-n junction between the semiconductor layer 24 and the semiconductor layer 18 may define a collector-base junction of the vertical heterojunction bipolar transistor structure, and the p-n junction between the semiconductor layer 24 and the semiconductor layer 30 may define an emitter-base junction of the vertical heterojunction bipolar transistor structure.

Figure 2:
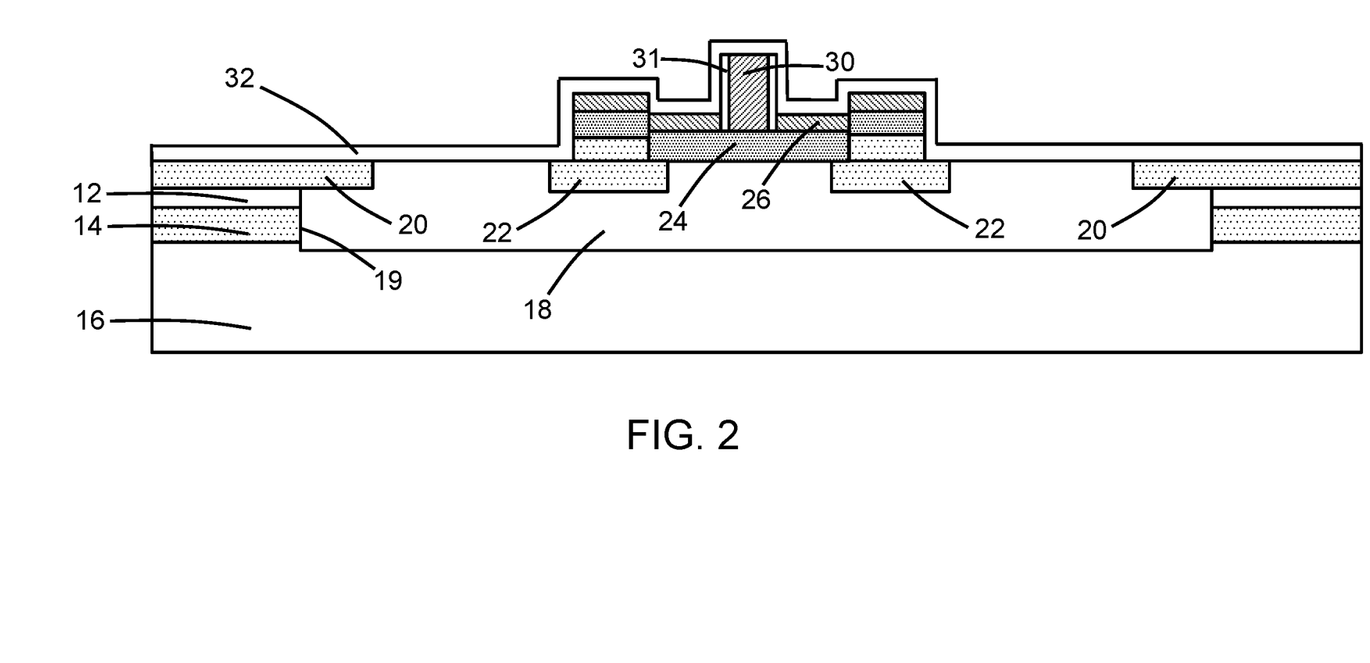
FIG. 2 is a cross-sectional view of the structure at a fabrication stage subsequent to FIG. 1.

With reference to FIG. 2 in which like reference numerals refer to like features in FIG. 1 and at a subsequent fabrication stage, a stress layer 32 is applied over the semiconductor layer 18, the semiconductor layers 24, 26, and the semiconductor layer 30. The stress layer 32 extends across and overlaps with the semiconductor layer 18, the semiconductor layers 24, 26, the semiconductor layer 30, and the shallow trench isolation regions 20 as a conformal film or coating. The stress layer 32 may be comprised of a dielectric material, such as silicon nitride, deposited by, for example, plasma-enhanced chemical vapor deposition under deposition conditions that cause the dielectric material to be under stress. In an embodiment, the deposition conditions may be tailored to introduce tensile strain in the stress layer 32. The overlap of the stress layer 32 with the semiconductor layer 30 includes the top surface and sidewalls of the emitter defined by the spacer-clad semiconductor layer 30, and the overlap of the stress layer 32 with the semiconductor layer 26 includes the top surface and sidewalls of the extrinsic base defined by the semiconductor layer 26.

Figure 3:
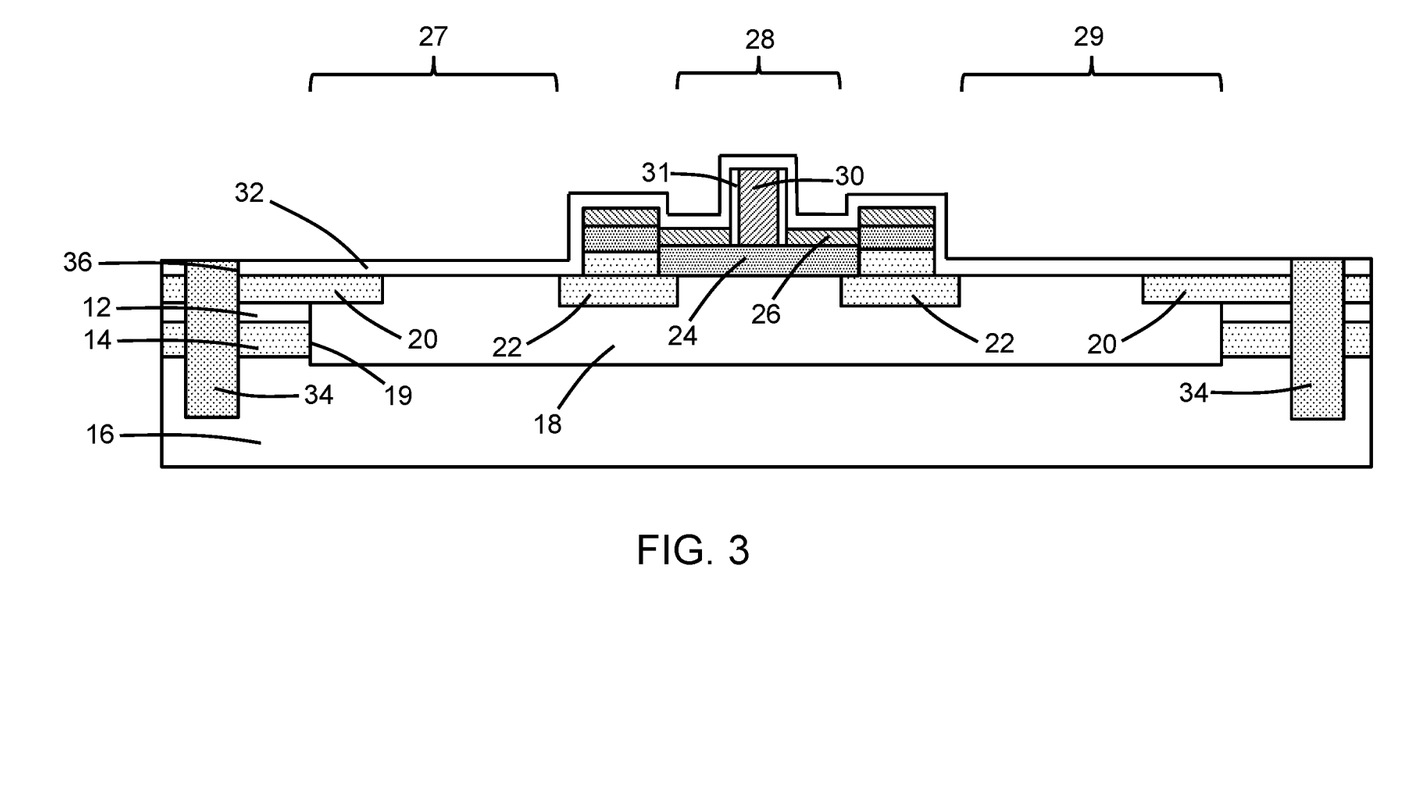
FIG. 3 is a cross-sectional view of the structure at a fabrication stage subsequent to FIG. 2.
Figure 3A:
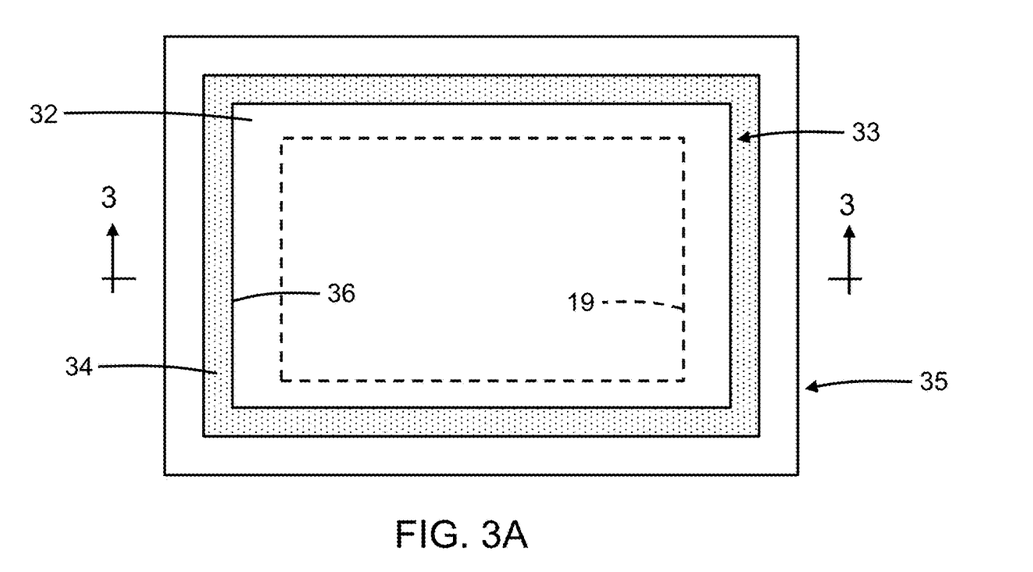

With reference to FIGS. 3, 3A in which like reference numerals refer to like features in FIG. 2 and at a subsequent fabrication stage, a deep trench isolation region 34 may be formed that penetrates or extends through the semiconductor layer 12 and buried insulator layer 14, and then penetrates into the semiconductor substrate 16. The deep trench isolation region 34 surrounds the perimeter 19 of the semiconductor layer 18 and may be laterally spaced outwardly from the perimeter 19 of the semiconductor layer 18. The deep trench isolation region 34 may be formed by etching a trench that surrounds the semiconductor layer 18 and that penetrates through the semiconductor layer 12 and buried insulator layer 14 into semiconductor substrate 16, and then filling the etched trench with one or more materials that are deposited and planarized with chemical mechanical polishing. In an embodiment, the deep trench isolation region 34 may include a liner comprised of silicon nitride and a core comprised of silicon dioxide. The deep trench isolation region 34 may be configured to apply an inward compressive stress to the semiconductor layer 18, for example, if the liner and/or core contain compressive strain.

In an embodiment, the deep trench isolation region 34 may be formed after the formation of the stress layer 32 such that the deep trench isolation region 34 penetrates through the stress layer 32 to reach the semiconductor layer 12. As a result, the stress layer 32 is cut to define a section 33 that is positioned to overlap with the semiconductor layer 18 defining the collector, the semiconductor layer 24 defining the intrinsic base, the semiconductor layer 26 defining the extrinsic base, and the semiconductor layer 30 defining the emitter. The section 33 of the stress layer 32 has a perimeter 36 that surrounds the semiconductor layer 18 and the vertical heterojunction bipolar transistor of which the semiconductor layer 18 provides the collector. The perimeter 36 defines a boundary of the cut in the stress layer 32 forming the section 33. In an embodiment, the section 33 of the stress layer 32 may adjoin or abut, or otherwise be aligned with, the deep trench isolation region 34 at the perimeter 36 of the section 33 of the stress layer 32. In an embodiment, the stress layer 32 may include a section 35 that is retained outside of the deep trench isolation region 34 such that the section 35 is fully disconnected by the cut from the section 33 and the section 35 has an inner perimeter aligned with the deep trench isolation region 34.

Sections 27, 29 of the semiconductor layer 18 are arranged in a lateral direction between the deep trench isolation region 34 and a section 28 of the semiconductor layer 18 arranged beneath the semiconductor layer 24 inside of the shallow trench isolation regions 20. The section 33 of the stress layer 32 overlaps with the sections 27, 29 of the semiconductor layer 18 and also overlaps with the perimeter 19 of the semiconductor layer 18. A portion of the buried insulator layer 14 is positioned in a lateral direction between the section 27 of the semiconductor layer 18 and the perimeter 36 of the stress layer 32. Another portion of the buried insulator layer 14 is positioned in a lateral direction between the section 29 of the semiconductor layer 18 and the perimeter 36 of the stress layer 32.

The section 27 of the semiconductor layer 18 at the associated portion of the perimeter 19 is spaced inwardly from the perimeter 36 of the section 33 of the stress layer 32 by a distance D1, and the section 29 of the semiconductor layer 18 at the associated portion of the perimeter 19 is spaced inwardly from the perimeter 36 of the section 33 of the stress layer 32 by a distance D2. In an embodiment, the distance D1 may be equal to the distance D2. In an embodiment, the distance D1 and the distance D2 may range from 0.1 microns to less than or equal to 2 microns. Distances D1, D2 that are greater than a maximum spacing of 2 microns may significantly reduce the effectiveness of the cut stress layer 32.

The cut in the stress layer 32 provided by the formation of the deep trench isolation region 34 releases the section 33 of the stress layer 32 from a constrained condition that is static. As a result, the section 33 of the stress layer 32 is free to relax inwardly and establish a different static condition. In the different static condition, the relaxed section 33 of the stress layer 32 may generate tensile stress applied to the semiconductor layer 18 that reduces, and compensates for, compressive stress in the portion of the semiconductor layer 18 beneath the portion of the semiconductor layer 24 providing the intrinsic base of the heterojunction bipolar transistor.

Figure 4:
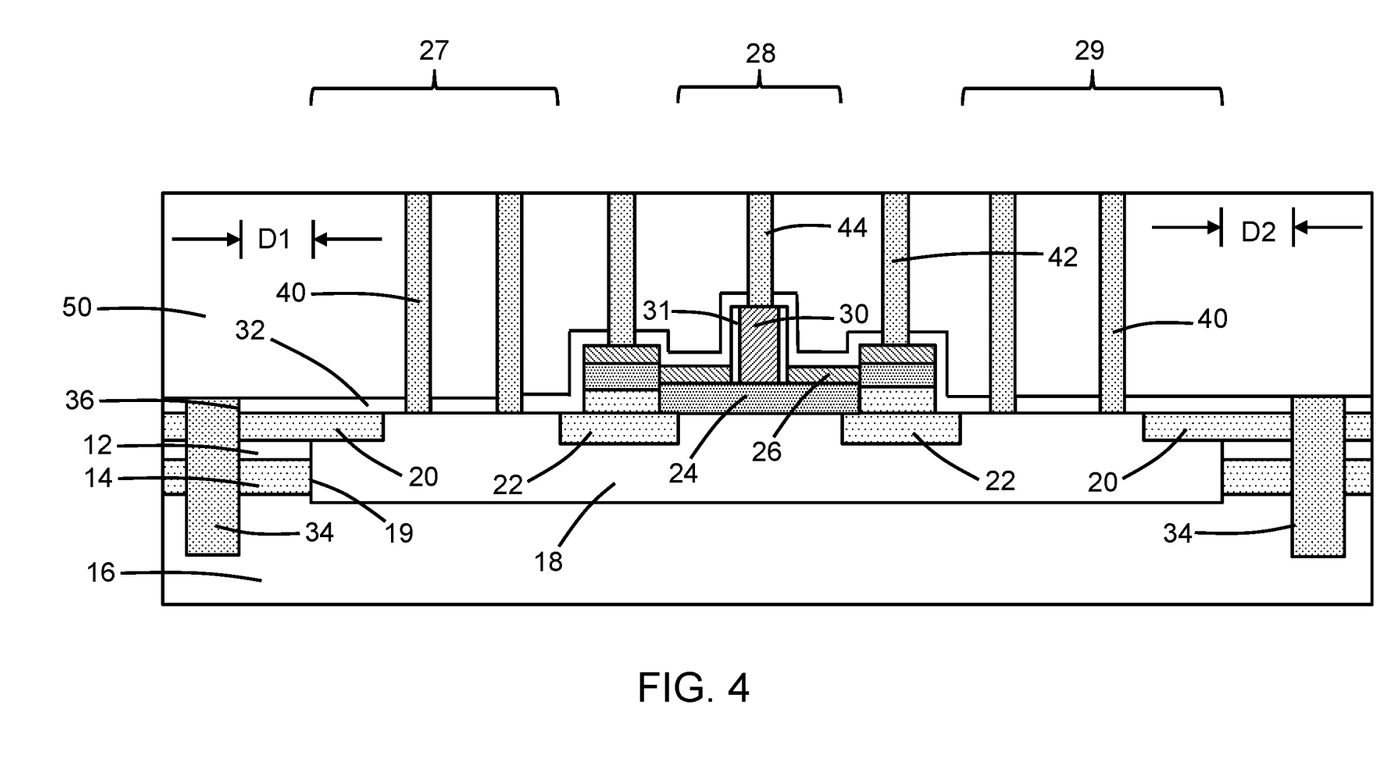
FIG. 4 is a cross-sectional view of the structure at a fabrication stage subsequent to FIG. 3.

With reference to FIG. 4 in which like reference numerals refer to like features in FIG. 3 and at a subsequent fabrication stage, contacts 40, which are formed by middle-of-line processing in a dielectric layer 50, may be respectively physically and electrically connected to the section 27 and the section 29 of the semiconductor layer 18 providing the collector. Contacts 42 may be respectively physically and electrically connected to the semiconductor layer 26 to provide a connection to the semiconductor layer 24 providing the base. Contacts 42 may be respectively physically and electrically connected to the semiconductor layer 30 providing the emitter. The contacts 40, 42, 44 may be comprised of a metal, such as tungsten, and the dielectric layer 50 may be comprised of a dielectric material, such as silicon dioxide. The contacts 40, 42, 44 penetrate through the stress layer 32 at localized positions.

The resultant structure is a vertical heterojunction bipolar transistor with a vertically-stacked arrangement for the emitter, base, and collector. The cut stress layer 32 may be effective for improving the carrier mobility in the heterojunction bipolar transistor such that a higher frequency (fT/fmax) can be achieved for radiofrequency applications. In an embodiment, the tensile stress transferred from the cut stress layer 32 to the portion of the semiconductor layer 18 (i.e., section 28) beneath the semiconductor layer 24 may be particularly effective for improving the performance of an NPN heterojunction bipolar transistor.

In an alternative embodiment, the cut stress layer 32 may contain compressive strain and may be formed in connection with a PNP heterojunction bipolar transistor in which the semiconductor layer 18 and the semiconductor layer 30 have p-type conductivity and the semiconductor layer 24 has n-type conductivity. The relaxation of the section 33 of the stress layer 32 may generate compressive stress applied to the semiconductor layer 18 that reduces, and compensates for, tensile stress in the portion of the semiconductor layer 18 (i.e., section 28) beneath the portion of the semiconductor layer 24 providing the intrinsic base of the PNP heterojunction bipolar transistor.

Figure 5:
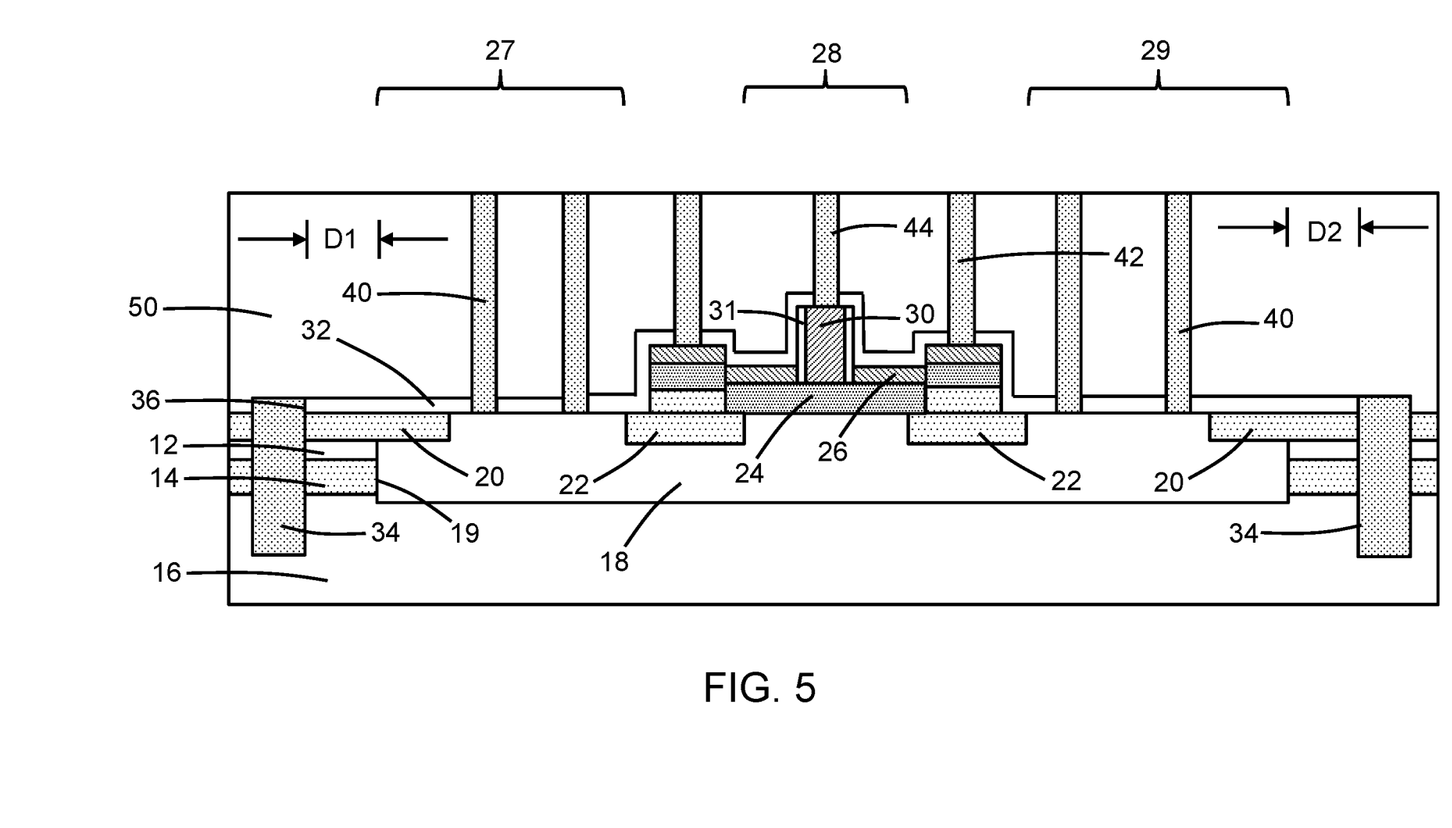
FIG. 5 is a cross-sectional view in accordance with alternative embodiments of the invention.

With reference to FIG. 5 and in accordance with alternative embodiments, the section 35 of the stress layer 32 may be absent outside of the deep trench isolation region 34, and the associated cut, such that the stress layer 32 only includes the non-removed section 33 that is located interior of the perimeter 36. In an embodiment, the section 35 of the stress layer 32 may be removed by patterning with lithography and etching processes.

Figure 6:
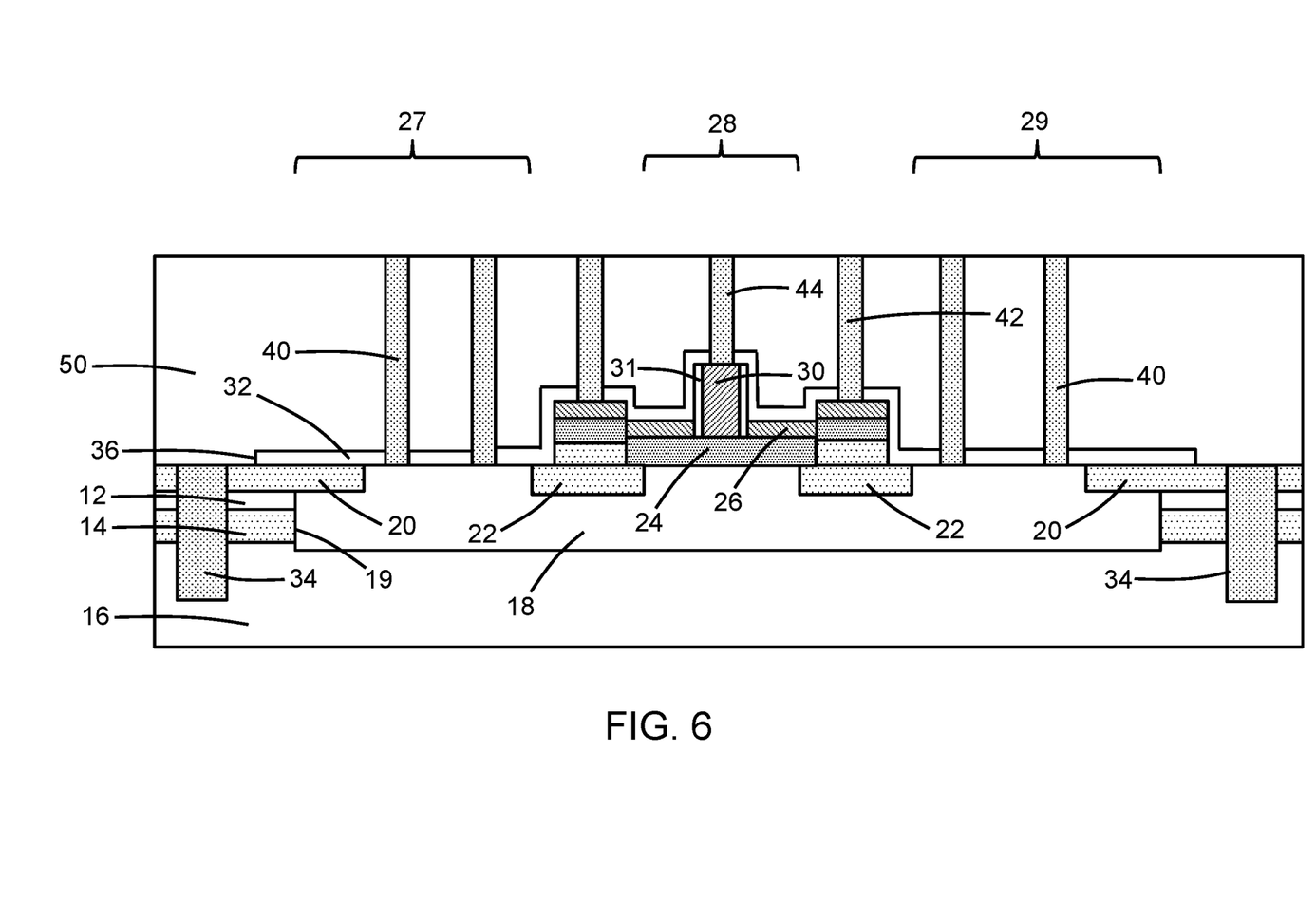
FIG. 6 is a cross-sectional view in accordance with alternative embodiments of the invention.

With reference to FIG. 6 and in accordance with alternative embodiments, the perimeter 36 of the section 33 of the stress layer 32 may be disposed between the deep trench isolation region 34 and the perimeter of the semiconductor layer 18 providing the collector. The perimeter 36 of the section 35 of the stress layer 32 may be established by patterning with lithography and etching processes.

Figure 7:
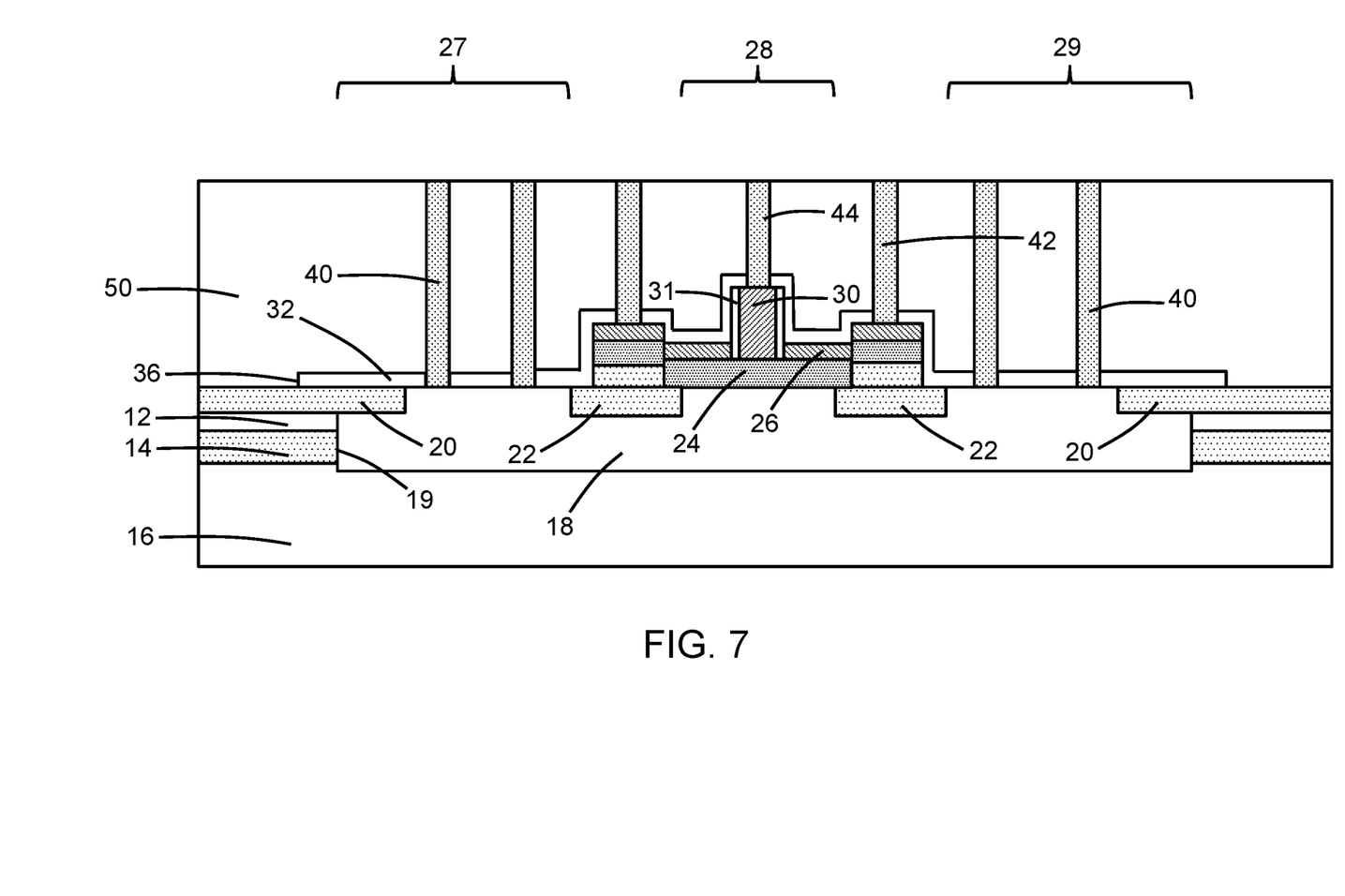
FIG. 7 is a cross-sectional view in accordance with alternative embodiments of the invention.

With reference to FIG. 7 and in accordance with alternative embodiments, the stress layer 32 may be patterned by lithography and etching processes to provide the cut at the perimeter 36 and to provide the section 33 without forming the deep trench isolation region 34. Alternatively, the section 35 of the stress layer 32 may be retained during patterning such that the cut separates the non-removed section 35 from the section 33.

Figure 8:
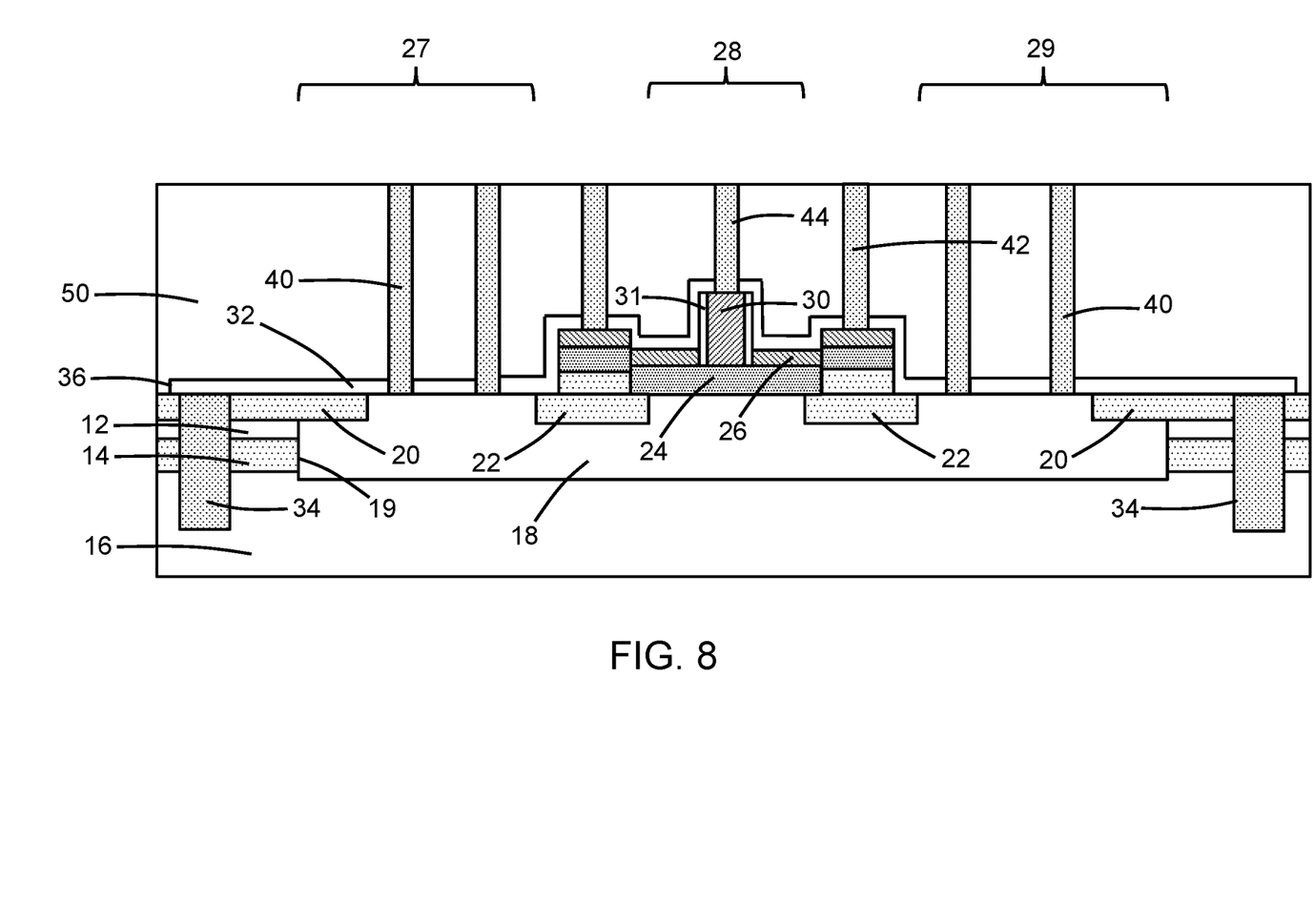
FIG. 8 is a cross-sectional view in accordance with alternative embodiments of the invention.

With reference to FIG. 8 and in accordance with alternative embodiments, the stress layer 32 may be patterned by lithography and etching processes to provide the cut at the perimeter 36 and to provide the section 33, and the section 33 may overlap with the deep trench isolation region 34. Alternatively, the section 35 of the stress layer 32 may be retained during patterning such that the cut separates the non-removed section 35 from the section 33.

Figure 9:
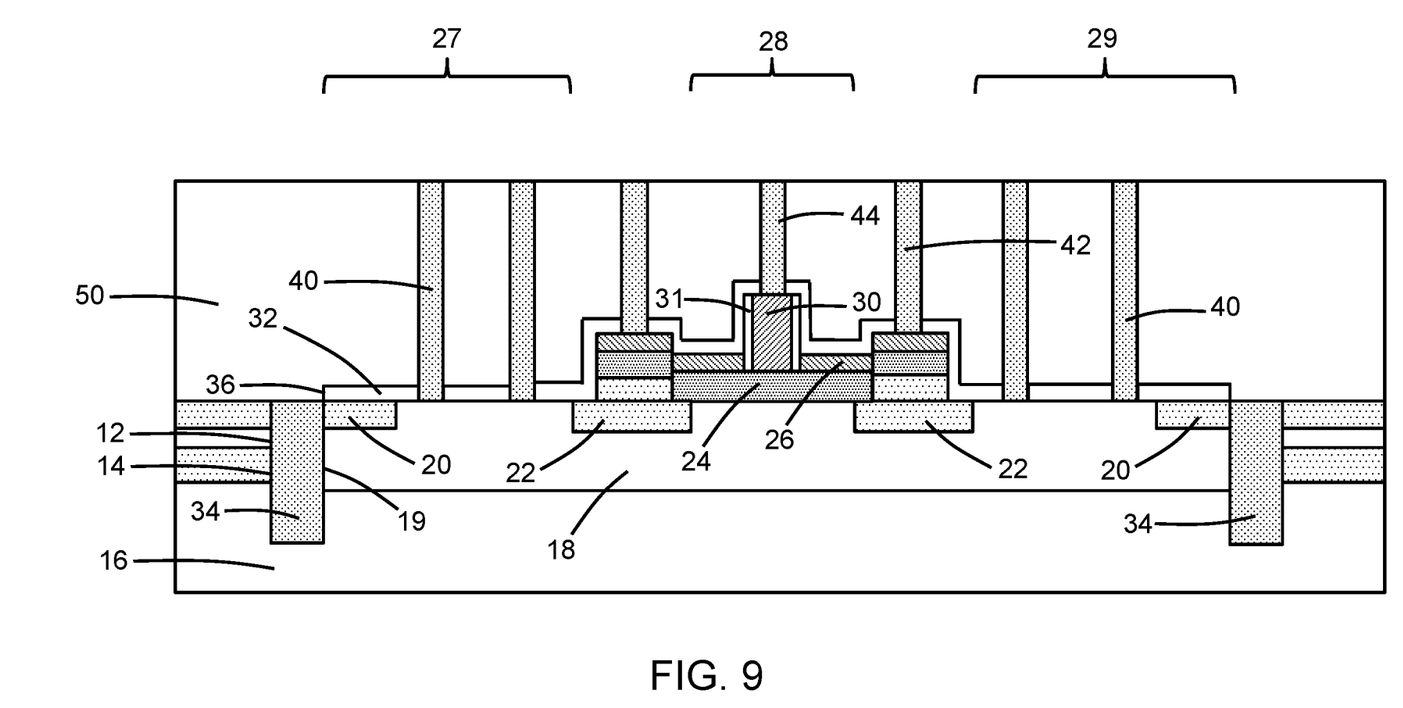
FIG. 9 is a cross-sectional view in accordance with alternative embodiments of the invention.

With reference to FIG. 9 and in accordance with alternative embodiments, the deep trench isolation region 34 may be relocated to abut the sections 27, 29 of the semiconductor layer 18 and penetrate through the stress layer 32. The perimeter 36 of the section 33 of the stress layer 32 is aligned with the section 27 over a portion of the perimeter 19 of the semiconductor layer 18, and the perimeter 36 of the section 33 of the stress layer 32 is also aligned with the section 29 over a portion of the perimeter 19 of the semiconductor layer 18.

The methods as described above are used in the fabrication of integrated circuit chips. The resulting integrated circuit chips can be distributed by the fabricator in raw wafer form (e.g., as a single wafer that has multiple unpackaged chips), as a bare die, or in a packaged form. The chip may be integrated with other chips, discrete circuit elements, and/or other signal processing devices as part of either an intermediate product or an end product. The end product can be any product that includes integrated circuit chips, such as computer products having a central processor or smartphones.

References herein to terms modified by language of approximation, such as "about", "approximately", and "substantially", are not to be limited to the precise value specified. The language of approximation may correspond to the precision of an instrument used to measure the value and, unless otherwise dependent on the precision of the instrument, may indicate +/−10% of the stated value(s).

References herein to terms such as "vertical", "horizontal", etc. are made by way of example, and not by way of limitation, to establish a frame of reference. The term "horizontal" as used herein is defined as a plane parallel to a conventional plane of a semiconductor substrate, regardless of its actual three-dimensional spatial orientation. The terms "vertical" and "normal" refer to a direction in the frame of reference perpendicular to the horizontal, as just defined. The term "lateral" refers to a direction in the frame of reference within the horizontal plane.

A feature "connected" or "coupled" to or with another feature may be directly connected or coupled to or with the other feature or, instead, one or more intervening features may be present. A feature may be "directly connected" or "directly coupled" to or with another feature if intervening features are absent. A feature may be "indirectly connected" or "indirectly coupled" to or with another feature if at least one intervening feature is present. A feature "on" or "contacting" another feature may be directly on or in direct contact with the other feature or, instead, one or more intervening features may be present. A feature may be "directly on" or in "direct contact" with another feature if intervening features are absent. A feature may be "indirectly on" or in "indirect contact" with another feature if at least one intervening feature is present. Different features "overlap" if a feature extends over, and covers a part of, another feature.

The descriptions of the various embodiments of the present invention have been presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A structure for a heterojunction bipolar transistor, the structure comprising:
   an emitter;
   a collector including a first section, a second section, and a third section positioned in a first direction between the first section and the second section;
   an intrinsic base disposed in a second direction between the emitter and the third section of the collector; and
   a stress layer including a first section positioned to overlap with the emitter, the intrinsic base, and the collector, the first section of the stress layer surrounded by a perimeter,
   wherein the first section and the second section of the collector are positioned adjacent to the perimeter of the stress layer, the collector has n-type conductivity, and the stress layer contains tensile stress.

2. The structure of claim 1 wherein the first section of the collector is spaced inwardly from the perimeter of the stress layer by a first distance, and the second section of the collector is spaced inwardly from the perimeter of the stress layer by a second distance.

3. The structure of claim 2 wherein the first distance is equal to the second distance.

4. The structure of claim 2 wherein the first distance and the second distance each range from 0.1 microns to less than or equal to 2 microns.

5. The structure of claim 2 further comprising:
   a dielectric layer including a first portion and a second portion, the first portion of the dielectric layer positioned in the first direction between the first section of the collector and the perimeter of the stress layer, and the second portion positioned in the first direction between the second section of the collector and the perimeter of the stress layer.

6. The structure of claim 1 wherein the collector has a perimeter, and the perimeter of the first section of the stress layer surrounds the perimeter of the collector.

7. The structure of claim 6 wherein the first section of the stress layer overlaps with the perimeter of the collector.

8. The structure of claim 1 further comprising:
   a deep trench isolation region surrounding the perimeter of the first section of the stress layer.

9. The structure of claim 8 wherein the deep trench isolation region adjoins the first section of the stress layer at the perimeter of the first section of the stress layer.

10. The structure of claim 9 wherein the stress layer includes a second section that surrounds the first section of the stress layer, and the deep trench isolation region separates the first section of the stress layer from the second section of the stress layer.

11. The structure of claim 8 wherein the perimeter of the first section of the stress layer is positioned in the first direction between the deep trench isolation region and the first section of the collector, and the perimeter of the first section of the stress layer is positioned in the first direction between the deep trench isolation region and the second section of the collector.

12. The structure of claim 8 further comprising:
a shallow trench isolation region adjacent to the deep trench isolation region,
wherein the first section of the stress layer overlaps with the shallow trench isolation region.

13. The structure of claim 12 wherein the shallow trench isolation region includes a portion in the collector.

14. The structure of claim 1 wherein the first section of the collector is aligned the perimeter of the stress layer, and the second section of the collector is aligned with the perimeter of the stress layer.

15. The structure of claim 1 further comprising:
a first plurality of contacts that extend through the first section of the stress layer to the first section of the collector; and
a second plurality of contacts that extend through the first section of the stress layer to the second section of the collector.

16. The structure of claim 1 wherein the first direction is transverse to the second direction.

17. The structure of claim 1 wherein the stress layer includes a second section that surrounds the perimeter of the first section of the stress layer, and the second section of the stress layer is disconnected from the first section of the stress layer.

18. The structure of claim 1 further comprising:
a deep trench isolation region,
wherein the first section of the stress layer overlaps with the deep trench isolation region.

19. The structure of claim 2 wherein the collector has a perimeter, and the perimeter of the first section of the stress layer surrounds the perimeter of the collector.

20. A method of forming a structure for a heterojunction bipolar transistor, the method comprising:
forming an emitter;
forming a collector including a first section, a second section, and a third section positioned in a first direction between the first section and the second section, wherein the collector has n-type conductivity;
forming an intrinsic base disposed in a second direction between the emitter and the third section of the collector; and
forming a stress layer including a section positioned to overlap with the emitter, the intrinsic base, and the collector, wherein the stress layer contains tensile stress, the section of the stress layer is surrounded by a perimeter, and the first section and the second section of the collector are positioned adjacent to the perimeter of the stress layer.

* * * * *